United States Patent
Chakraborty et al.

(10) Patent No.: US 9,450,745 B2
(45) Date of Patent: Sep. 20, 2016

(54) METHOD AND APPARATUS FOR RADIO FREQUENCY (RF) PULSE SYNCHRONIZATION IN SUPER REGENERATIVE RECEIVER (SRR)

(71) Applicant: SAMSUNG ELECTRONICS CO., LTD., Suwon-si (KR)

(72) Inventors: Tuhin Subhra Chakraborty, Bangalore (IN); Kiran Bynam, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/050,616

(22) Filed: Oct. 10, 2013

(65) Prior Publication Data

US 2014/0105344 A1    Apr. 17, 2014

(30) Foreign Application Priority Data

Oct. 11, 2012  (IN) .......................... 4261/CHE/2012
May 13, 2013  (KR) ....................... 10-2013-0053508

(51) Int. Cl.
*H04L 27/00*  (2006.01)
*H04L 7/00*  (2006.01)
*H04L 7/033*  (2006.01)
*H03D 11/06*  (2006.01)
*H04B 1/7183*  (2011.01)

(52) U.S. Cl.
CPC ............. *H04L 7/0033* (2013.01); *H03D 11/06* (2013.01); *H04B 1/7183* (2013.01); *H04L 7/033* (2013.01); *H04L 27/0014* (2013.01); *H04L 2027/0028* (2013.01); *H04L 2027/0067* (2013.01)

(58) Field of Classification Search
CPC .................. H04L 27/0014; H04L 2027/0067; H04L 2027/0028; H04L 7/0033; H04L 7/033; H04B 1/7183; H03D 11/06
USPC .................................................. 375/371, 260
See application file for complete search history.

(56) References Cited

U.S. PATENT DOCUMENTS

| | | | |
|---|---|---|---|
| 6,249,395 B1 * | 6/2001 | Conway ........... | G11B 20/10009 360/51 |
| 6,487,264 B1 * | 11/2002 | Alley .................. | H04L 25/4904 340/693.3 |
| 6,668,165 B1 * | 12/2003 | Cloutier .................... | H03F 1/32 330/112 |
| 8,115,673 B1 * | 2/2012 | McEwan ................. | G01S 7/288 342/110 |
| 8,832,468 B2 * | 9/2014 | Pop ........................ | G01D 21/00 713/300 |
| 2003/0137446 A1 * | 7/2003 | Vavik .................... | G01S 13/767 342/51 |
| 2003/0137765 A1 * | 7/2003 | Yamazaki ................ | G11B 5/09 360/39 |
| 2004/0198288 A1 * | 10/2004 | Sadowski .............. | H03D 11/02 455/259 |
| 2004/0210289 A1 * | 10/2004 | Wang ................... | A61K 9/5094 607/116 |

(Continued)

OTHER PUBLICATIONS

Ravishankar, D.SBPSK Based Super Regenerative Receiver TUDelft—Mater of Science ThesisJul. 2012.*

(Continued)

*Primary Examiner* — Daniel Washburn
*Assistant Examiner* — Berhanu Tadese
(74) *Attorney, Agent, or Firm* — NSIP Law

(57) ABSTRACT

A method for radio frequency (RF) pulse synchronization in a super regenerative receiver (SRR), includes receiving an input signal including an asymmetric preamble, and estimating a phase difference between the input signal and a quench signal based on the asymmetric preamble. The method further includes compensating for the phase difference.

19 Claims, 6 Drawing Sheets

(56) References Cited

U.S. PATENT DOCUMENTS

| | | | | |
|---|---|---|---|---|
| 2005/0068223 A1* | 3/2005 | Vavik | ............... | H04B 7/155 342/51 |
| 2005/0069051 A1* | 3/2005 | Lourens | ............... | H03D 11/02 375/316 |
| 2007/0139130 A1* | 6/2007 | Kim | ............... | H03D 11/06 331/185 |
| 2009/0017782 A1* | 1/2009 | Monat | ............... | G01S 7/285 455/130 |
| 2009/0156158 A1* | 6/2009 | Kang | ............... | H04B 1/24 455/336 |
| 2011/0274141 A1* | 11/2011 | Jantunen | ............... | H04B 1/7183 375/138 |
| 2012/0307839 A1* | 12/2012 | Ionescu | ............... | H04L 5/0033 370/431 |
| 2013/0101013 A1* | 4/2013 | Kim | ............... | H04L 25/4902 375/239 |
| 2013/0114645 A1* | 5/2013 | Huang | ............... | H04B 1/7083 375/147 |

OTHER PUBLICATIONS

Ravishankar, D.S ,"BPSK Based Super Regenerative Receiver," TUDelft—Mater of Science Thesis, Jul. 2012.*

* cited by examiner

METHOD AND APPARATUS FOR RADIO FREQUENCY (RF) PULSE SYNCHRONIZATION IN SUPER REGENERATIVE RECEIVER (SRR)

CROSS-REFERENCE TO RELATED APPLICATIONS

This application claims the benefit under 35 USC 119(a) of Indian Patent Application No. 4261/CHE/2012, filed on Oct. 11, 2012, in the Indian Patent Office, and Korean Patent Application No. 10-2013-0053508, filed on May 13, 2013, in the Korean Intellectual Property Office, the entire disclosures of which are incorporated herein by reference for all purposes.

BACKGROUND

1. Field

The following description relates to a method and an apparatus for radio frequency (RF) pulse synchronization in a super regenerative receiver (SRR).

2. Description of Related Art

The existing market for low-cost, low-power consuming and sensitive radio frequency receivers is huge, and current technology solutions are fairly expensive. The power consumption of such receivers keeps this technology out of the mass markets, such as energy metering, e-health, and lower end consumer electronics. In general, a super regenerative receiver (SRR) may be realized with much lower energy and power consumption and fewer components, and operated with lower voltage, compared to a homodyne or super-heterodyne receiver. Thus, the SRR may be suitable for a communication system that requires a low-cost and low-power receiver.

The SRR circuit architecture may find its application in the design of low-power and energy aware sensor networks. The main principle of the SRR may be based on the controlled feedback between positive and negative feedbacks and the theory of quenching. A quench oscillator may cause periodic build up and decays of oscillations during the duration of positive and negative feedback, respectively. These oscillations may be maximized at the zero crossing where the quench signal goes toward the positive half cycle. If the quench signal is not synchronized with an input data signal, then the energy of the output of the SRR will be decreased. Therefore, it is important for the quench signal to be accurately synchronized to the carrier at the peak points.

A conventional method in the art may control power by supplying the power to the super regenerative receiver within the start-up time period of the oscillator. The method may include adjusting a duty cycle ratio, and periodically turning off the power of the super regenerative receiver.

Another conventional method may provide frequency stabilization by means of a sampling phase-locked loop circuit. The method may further provide a frequency stabilization circuit, which does not require continuous operation of the phase-locked loop or the SRR.

The main issue associated with the SRR may be the synchronization of the input data with the locally-generated oscillator. The conventional method may solve such an issue recursively, which may be useful in case of analog methods. Due to the aforementioned reasons, there is a need for efficient synchronization between the input data signal and the quench signal.

SUMMARY

In one general aspect, there is provided a method for radio frequency (RF) pulse synchronization in a super regenerative receiver (SRR), the method including receiving an input signal including an asymmetric preamble, and estimating a phase difference between the input signal and a quench signal based on the asymmetric preamble. The method further includes compensating for the phase difference.

The asymmetric preamble may include a packet detection preamble and/or an RF pulse synchronization preamble.

The RF pulse synchronization preamble may be added after the packet detection preamble in the input signal.

The method may further include receiving the RF pulse synchronization preamble for different offsets.

The estimating of the phase difference may include capturing energy of the asymmetric preamble.

The compensating for the phase difference may include delaying the quench signal generated in the SRR.

A non-transitory computer-readable storage medium may store a program including instructions to cause a computer to perform the method.

In another general aspect, there is provided an apparatus for radio frequency (RF) pulse synchronization in a super regenerative receiver (SRR), the apparatus including a processor configured to receive an input signal including an asymmetric preamble, and estimate a phase difference between the input signal and a quench signal based on the asymmetric preamble. The processor is further configured to compensate for the phase difference.

In still another general aspect, there is provided a receiver for radio frequency (RF) pulse synchronization, the receiver including a processor configured to receive an input signal including an asymmetric preamble, and estimate a quench signal with a maximum energy capture during packet detection. The processor is further configured to find a pulse with a maximum energy capture from the asymmetric preamble, and calculate a phase difference between the quench signal and the input signal based on the asymmetric preamble and the pulse. The processor is further configured to delay the quench signal to compensate for the phase difference.

The processor may be configured to synchronize the input signal and the quench signal to capture maximum energy.

The processor may be a baseband processor.

In yet another general aspect, there is provided an apparatus including a processor configured to estimate a phase difference between an input signal including a preamble and a quench signal generated by a quench oscillator, based on the preamble, and synchronize the quench signal with the input signal based on the phase difference.

A center point of the synchronized quench signal may be aligned with a peak point of a center pulse of the preamble.

The processor may be configured to delay the quench signal by the phase difference.

Other features and aspects will be apparent from the following detailed description, the drawings, and the claims.

DETAILED DESCRIPTION

Figure 1:
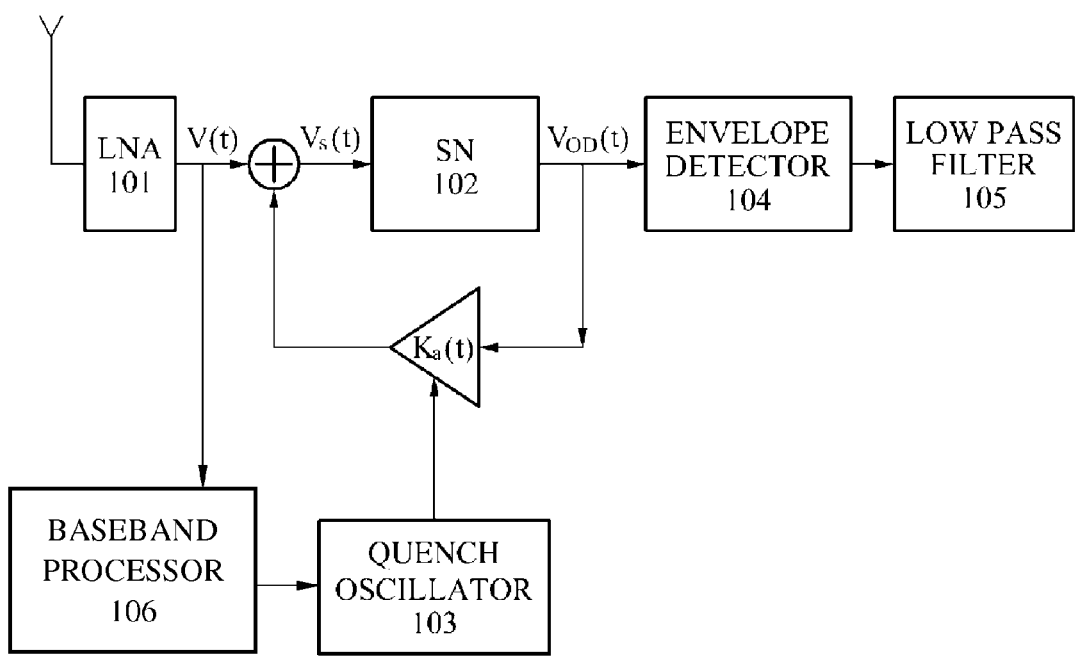
FIG. 1 is a block diagram illustrating an example of a super regenerative receiver (SRR).

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Examples of a method and an apparatus described herein may provide a time synchronization between a quench signal generated by a quench oscillator and an input data signal by transmitting asymmetric preamble chips for different offsets after a packet detection preamble. A baseband processor in a super regenerative receiver (SRR) may estimate a phase difference between a locally-generated quench signal q(t) and an input signal v(t) coarsely, and adjust a phase of the quench signal q(t) in order to achieve better radio frequency (RF) pulse synchronization.

FIG. 1 illustrates an example of a super regenerative receiver (SRR). Referring to FIG. 1, the SRR includes a low noise amplifier (LNA) 101, a selective network (SN) 102, a quench oscillator 103, an envelope detector 104, a low pass filter (LPF) 105, and a baseband processor 106.

The LNA 101 isolates an antenna from a remaining circuit. The LNA 101 amplifies weaker signals received from the antenna to generate a baseband input signal V(t).

The SN 102 includes a resonant circuit tuned to a center frequency of operation. The quench oscillator 103 generates a quench signal that oscillates between positive and negative cycles, which pushes the resonant circuit in the SN 102 to alternatively operate as a positive feedback system and a negative feedback system. When the resonant circuit in the SN 102 operates as the positive feedback system, oscillations of a data signal $V_{OD}(t)$ output from the SN 102 may be amplified by a variable gain $K_a(t)$ of an amplifier, and is added to the input signal V(t) to generate a data signal $V_s(t)$ input to the SN 102. The quench oscillator 103 controls the variable gain $K_a(t)$ of a super regenerative oscillator including the SN 102, the quench oscillator 103, and the amplifier. The quench oscillator 103 causes a periodic build up and decay of RF oscillations. Therefore, the data signal $V_{OD}(t)$ output from the super regenerative oscillator includes RF pulses separated by a quench period.

The envelope detector 104 detects an envelope of the data signal $V_{OD}(t)$ received from the SN 102, to process a baseband. The low pass filter 105 substantially removes the RF oscillations of the envelope. An output of the low pass filter 105 may correspond to an analog envelope of an RF signal received at the antenna.

Figure 2:
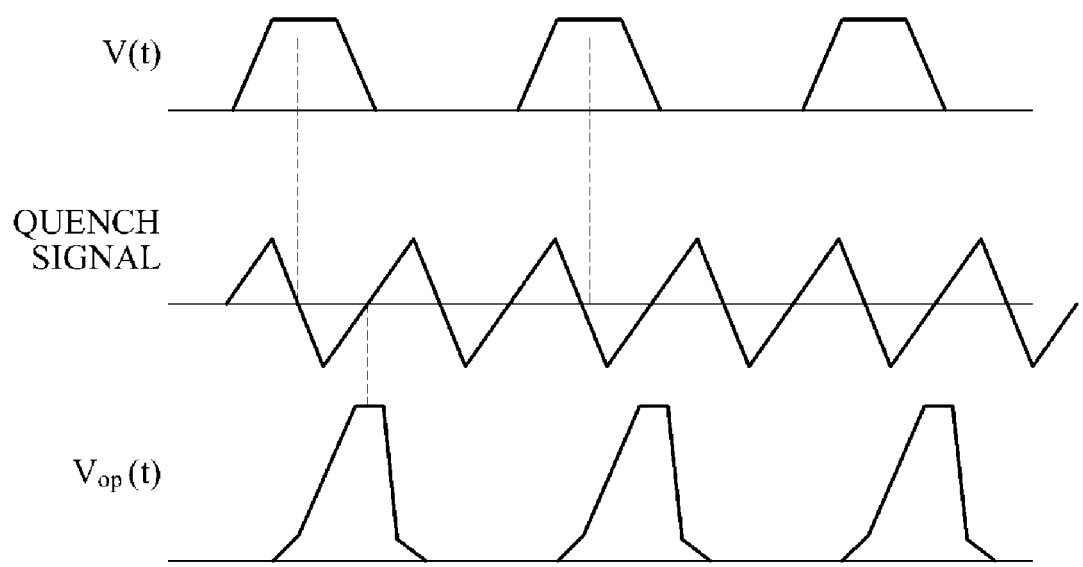
FIG. 2 is a diagram illustrating an example of waveforms of a baseband representation of signals for an SRR.

FIG. 2 illustrates an example of waveforms of a baseband representation of signals for an SRR. FIG. 2 depicts a baseband input signal V(t) of the SRR, a quench signal q(t) generated by the quench oscillator 103 of FIG. 1, and a baseband output signal $V_{op}(t)$ of the SRR. Further, the signals V(t) and $V_{op}(t)$ may include a carrier. Ideally, the quench signal q(t) is to become negative exactly during a middle of a pulse of the input signal V(t) to obtain a maximum amplitude of the output signal $V_{op}(t)$ when the quench signal q(t) becomes positive again. However, the quench signal may be generated locally in a receiver that is not synchronized.

Figure 3:
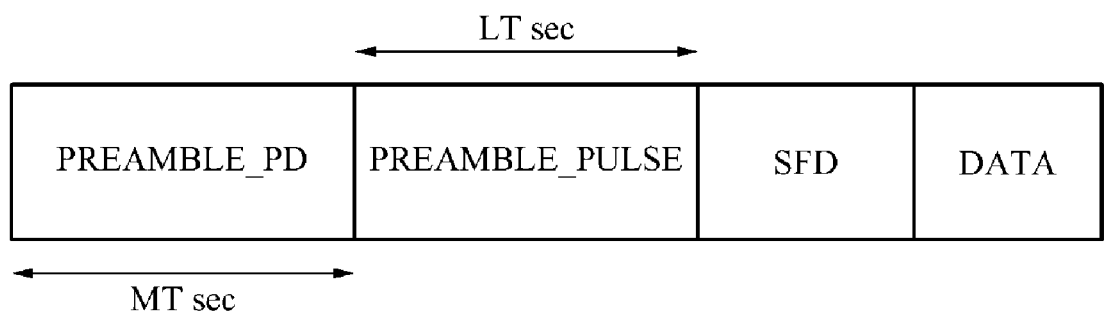
FIG. 3 is a diagram illustrating an example of a physical layer frame format.

FIG. 3 illustrates an example of a physical layer frame format. A method described herein includes transmitting, to an SRR, an asynchronous preamble in an RF signal (e.g., an input signal) to address RF pulse synchronization between an input signal V(t) and a quench signal q(t). Based on the preamble received in the RF signal, the baseband processor 106 of FIG. 1 in the SRR estimates a phase difference between the quench signal q(t) and the input signal V(t) coarsely, and adjusts a timing (or a phase) of the locally-generated signal q(t) in order to achieve the RF pulse synchronization.

The preamble includes a synchronization field that provides information to enable the SRR to perform synchronization procedures, which is followed by an optional Start Frame Delimiter (SFD) field to indicate an end of a SYNC field and a start of a data field. Further, a header in the RF signal may include signaling information, such as a modulation technique used by a transmitter, a time needed to transmit a payload, and a Cyclic Redundancy Check (CRC). In an example, the SFD field may be not present in the input signal V(t), and only the preamble and the data field may be present in the input signal V(t).

In more detail, referring to FIG. 3, the preamble includes two fields, a preamble for packet detection (preamble_PD) field and a preamble for RF pulse synchronization (preamble_pulse) field, which are followed by the SFD field. The preamble_PD field is transmitted for MT seconds, and preamble_pulse field is transmitted for LT seconds. M or L represents a number of pulses or chips, and T represents a time duration of each pulse or chip.

In an example, a quench rate may be assumed to be an integer number of times (e.g., 1, 2, or 3 times) a chip rate to achieve the RF pulse synchronization. An input signal S(t) may be represented as the following example of Equation 1:

$$S(t) = \text{preamble\_PD} + \text{preamble\_pulse} + \text{data} \quad (1)$$

$$\text{preamble\_pulse}(t) = \sum_{k=0}^{L-1} \text{chip}(k) * P(t - kT - (k((L-1)/2))\varepsilon - MT)$$

In Equation 1, preamble pulse (t) is a pulse shape, chip(k) is a predefined chip sequence, J=(L−1)/2 if L is odd, or J=L/2 if L is even, L is a total number of the chips, $\varepsilon$ is an offset between two successive chips, $\varepsilon$=T/((L−1), M is a number of preamble chips, and T is a quench time period, T=1/fq, where fq is a frequency of the quench signal q(t)

A value of L depends on a resolution of phase error estimation needed for the RF pulse synchronization to achieve a near optimal performance. If the resolution becomes larger, then L becomes larger.

Figure 4:
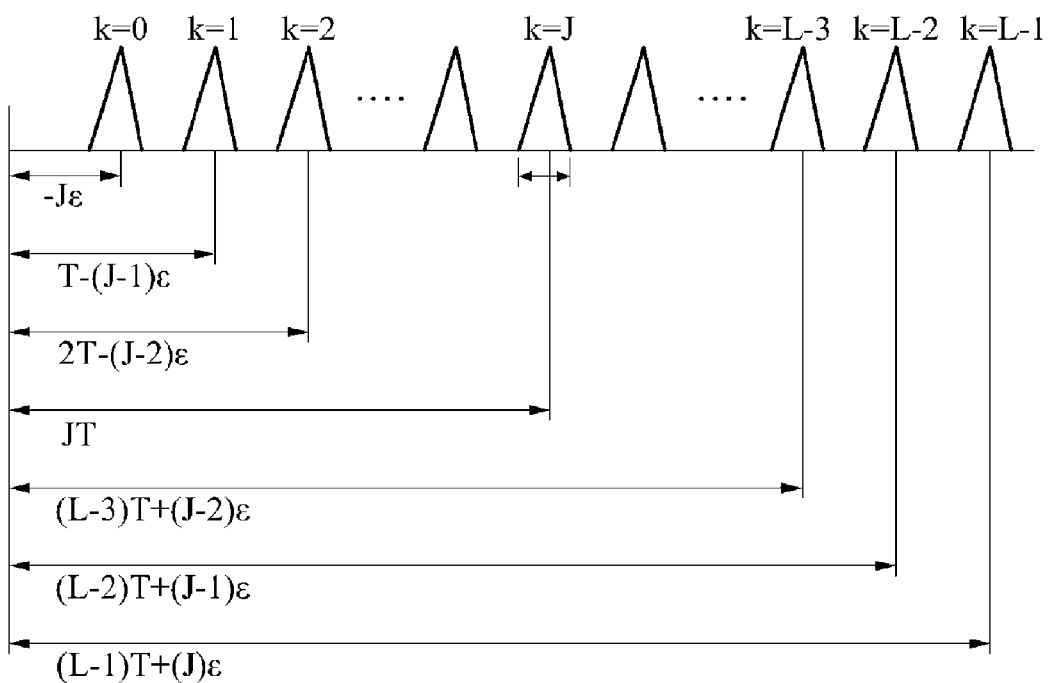
FIG. 4 is a diagram illustrating an example of a waveform of a structure of a preamble pulse signal.

FIG. 4 illustrates an example of a waveform of a structure of a preamble pulse signal. RF pulse synchronization may be performed after packet detection is performed. The RF pulse synchronization may be achieved in a series of the following operations.

In operation 1, the baseband processor 106 of FIG. 1 in the SRR estimates a quench cycle Q that gives an average maximum energy capture during packet detection, when a quench rate is greater than 1. This operation may be performed to find out a quench cycle Q of a chip giving a maximum energy within the chip. For example, if over quenching of 3, a value of the quench cycle Q may range between [1, 3] inclusive of 1 and 3.

In operation 2, the baseband processor 106 estimates a phase or time difference, for example, between the quench cycle estimated in operation 1 and a data signal pulse, by finding a preamble_pulse chip with a maximum energy capture, for example, an index of a pulse with a maximum energy of P.

In operation 3, the baseband processor 106 calculates a phase or time difference between a quench signal and an input data signal as $(P-J)*\epsilon$.

In operation 4, the baseband processor 106 delays the quench signal by $-(P-J)*\epsilon$ to compensate for the phase difference. If $-(P-J)*\epsilon$ is negative, the baseband processor 106 delays the quench cycle Q by $T-(P-J)*\epsilon$. If over quenching is used, the baseband processor 106 increases the quench cycle Q by 1, that is, Q=Q+1.

In operation 5, the SRR detects data on the same quench cycle Q identified in operations 1 and 4, after the phase difference is compensated for.

For a single quench cycle per chip operation, operations 1 to 4 may be skipped.

A transmitter may repeatedly transmit a preamble_pulse for a number of times, so a receiver may average the preamble_pulse to obtain an accurate phase shift needed for perfect synchronization. Further, extra zeros or ones may be padded at a beginning or end of the preamble_pulse in order to reduce inter-symbol interference (ISI) effects from a preamble_PD and minimize interference to data. An order of the preamble_pulse may be changed, and may also be interleaved with zeros without loss of generality. In a preamble pulse signal, pulses may be symmetric, whereas a timing may be asymmetric.

Figure 5:
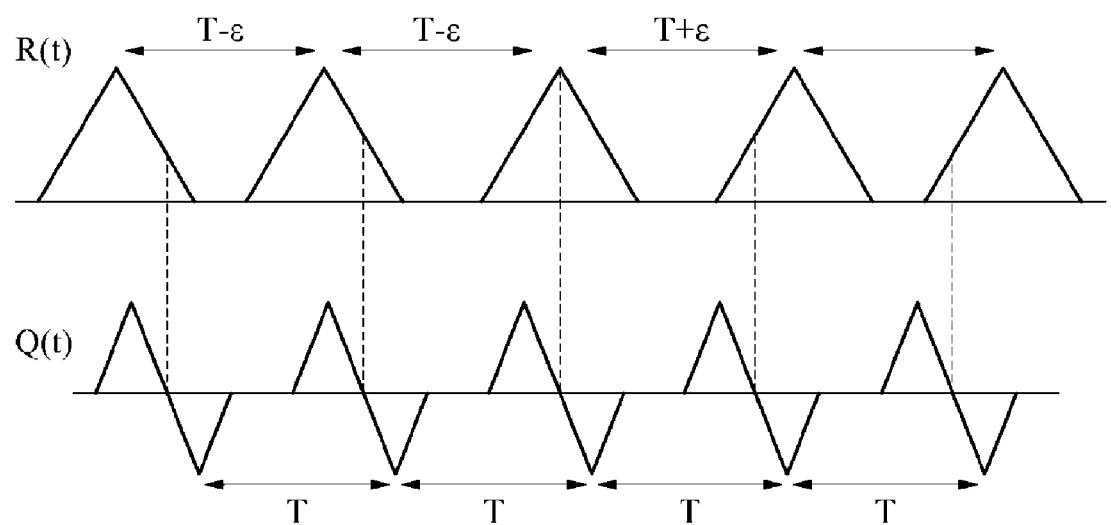
FIG. 5 is a diagram illustrating an example of waveforms of a preamble pulse signal and a quench signal when a center of the preamble pulse signal is synchronized with the quench signal.

FIG. 5 illustrates an example of waveforms of a preamble pulse signal R(t) and a quench signal Q(t) when a center of the preamble pulse signal R(t) is synchronized with the quench signal Q(t). FIG. 5 shows an impact of the preamble pulse signal R(t) at an input of a receiver and synchronization with the quench signal Q(t) that is periodic. For example, a peak point of a center ($j^{th}$) pulse (not shown) of the preamble pulse signal R(t) is synchronized with a center point the quench signal Q(t) (L=5) (not shown). Phase synchronization may be achieved between the quench signal Q(t) and an input data signal by transmission of asymmetric preamble chips for different offsets after a packet detection preamble. Further, a phase or time difference between the quench signal Q(t) and the preamble pulse signal R(t) may be estimated by observing energy capture on the preamble chips transmitted asymmetrically. The method may also compensate for the phase difference at a baseband processor in the receiver by delaying the quench signal Q(t).

Figure 6:
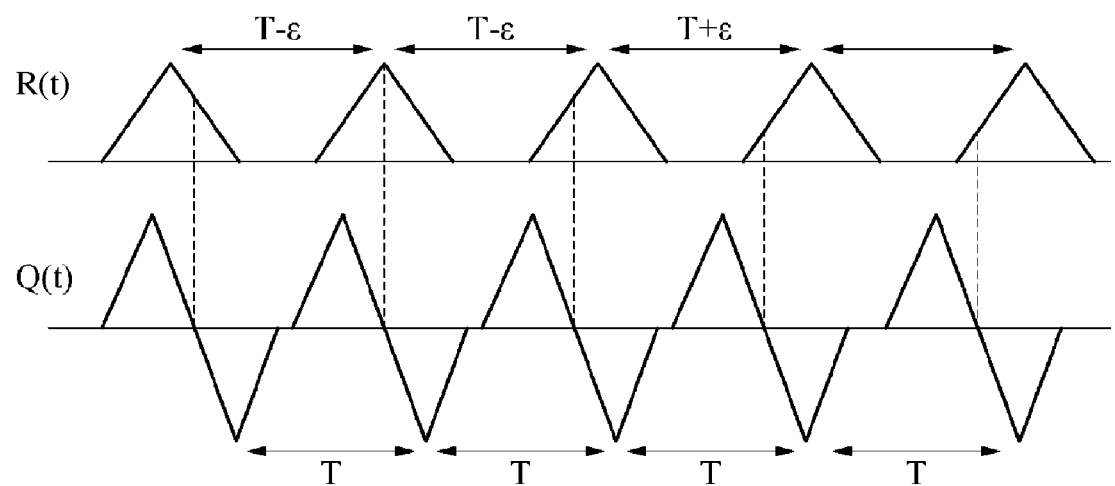
FIG. 6 is a diagram illustrating an example of waveforms of a preamble pulse signal and a quench signal when a center of the preamble pulse signal is not synchronized with the quench signal.

FIG. 6 illustrates an example of waveforms of a preamble pulse signal R(t) and a quench signal Q(t) when a center of the preamble pulse signal R(t) is not synchronized with the quench signal Q(t). Ideally, a center point of the quench signal Q(t) is to be aligned to a peak point of a center ($j^{th}$) pulse (not shown) of the preamble pulse signal R(t), as shown in FIG. 5. The quench signal Q(t), which is locally-generated in a receiver, may move from positive to negative. For example, referring again to FIG. 6, the peak point of the center ($j^{th}$) pulse (not shown) of the preamble pulse signal R(t) is not synchronized with the center point of the quench signal Q(t) (L=5) (not shown). During positive oscillations, no output may be generated, while some output may be generated during negative oscillations. Further, the positive oscillations may ensure that previous oscillations from a previous symbol will be killed The various elements and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may include various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions that control a processing device to implement a software component may include a computer program, a piece of code, an instruction, or some combination thereof, that independently or collectively instructs or configures the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments that implement the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for radio frequency (RF) pulse synchronization in a super regenerative receiver (SRR), the method comprising:
   receiving an input signal comprising an asymmetric preamble;
   estimating a quench cycle Q that gives an average maximum energy capture during packet detection;
   finding a preamble pulse chip with a maximum energy capture from the asymmetric preamble;
   estimating a phase difference between the input signal and a quench signal based on the preamble pulse chip;
   calculating the phase difference between the input signal and the quench signal; and
   compensating for the phase difference by adjusting the phase of a locally generated signal to achieve RF pulse synchronization between the input signal and the quench signal,
   wherein the asymmetric preamble comprises a packet detection preamble and the preamble pulse chip.

2. The method of claim 1, further comprising:
   receiving the preamble pulse chip for different offsets.

3. The method of claim 1, wherein the estimating of the phase difference comprises:
   capturing energy of the asymmetric preamble.

4. The method of claim 1, wherein the compensating for the phase difference comprises:
   delaying the quench signal generated in the SRR.

5. The method of claim 1, wherein the preamble_pulse chip is added after the packet detection preamble in the input signal.

6. An apparatus for radio frequency (RF) pulse synchronization in a super regenerative receiver (SRR), the apparatus comprising:
   a receiver configured to receive, by a processor, an input signal comprising an asymmetric preamble,
   an estimator configured to estimate, by the processor, a quench cycle Q that gives an average maximum energy capture during packet detection,
   a preamble pulse chip finder configured to estimate, by the processor, a phase difference between the input signal and a quench signal based on the preamble pulse chip,
   a calculator configured to calculate, by the processor, the phase difference between the input signal and the quench signal based on the preamble pulse chip, and
   compensator configured to compensate, by the processor, for the phase difference by adjusting the phase of a locally generated signal to achieve RF pulse synchronization between the input signal and the quench signal,
   wherein the asymmetric preamble comprises a packet detection preamble and the preamble pulse chip.

7. A non-transitory computer-readable storage medium storing a program comprising instructions to cause a computer to perform the method of claim 1.

8. The apparatus of claim 6, wherein the preamble_pulse chip is added after the packet detection preamble in the input signal.

9. The apparatus of claim 6, wherein the processor is further configured to:
receive the preamble pulse chip for different offsets.

10. The apparatus of claim 6, wherein the processor is configured to:
capture energy of the asymmetric preamble.

11. The apparatus of claim 6, wherein the processor is configured to:
delay the quench signal generated in the SRR.

12. A receiver for radio frequency (RF) pulse synchronization, the receiver comprising:
a receiver configured to receive, by a processor, an input signal comprising an asymmetric preamble,
an estimator configured to estimate, by the processor, a quench cycle Q that gives a maximum energy capture during packet detection,
a preamble_pulse chip finder configured to find, by the processor, a preamble_pulse chip with the maximum energy capture from the asymmetric preamble,
a calculator configured to calculate, by the processor, a phase difference between the input signal and a quench signal based on the preamble_pulse chip, and
a delayer configured to delay, by the processor, the quench signal to compensate for the phase difference by adjusting the phase of a locally generated signal to achieve RF pulse synchronization between the input signal and the quench signal,
wherein the asymmetric preamble comprises a packet detection preamble and the preamble_pulse chip.

13. The receiver of claim 12, wherein the processor is configured to:
synchronize the input signal and the quench signal to capture maximum energy.

14. The receiver of claim 12, wherein the processor is a baseband processor.

15. An apparatus comprising:
a receiver configured to receive, at a processor, an input signal comprising an asymmetric preamble,
an estimator configured to estimate, by the processor, a quench cycle Q that gives an average maximum energy capture during packet detection,
a preamble_pulse chip finder configured to find, by the processor, a preamble_pulse chip with the maximum energy capture,
an estimator configured to estimate, by the processor, a phase difference between the input signal comprising the asymmetric preamble and a quench signal generated by a quench oscillator based on the preamble_pulse chip,
a calculator configured to calculate, by the processor, the phase difference between the input signal and the quench signal based on the preamble_pulse chip, and
a synchronizer configured to synchronize, by the processor, the quench signal with the input signal based on the phase difference by adjusting the phase of a locally generated signal to achieve RF pulse synchronization between the input signal and the quench signal,
wherein the asymmetric preamble comprises a packet detection preamble and the preamble_pulse chip.

16. The apparatus of claim 15, wherein a center point of the synchronized quench signal is aligned with a peak point of a center pulse of the asymmetric preamble.

17. The apparatus of claim 15, wherein the processor is configured to:
delay the quench signal by the phase difference.

18. The method of claim 1, wherein the asymmetric preamble comprises a Start Frame Delimiter (SFD) field at the end of the asymmetric preamble to indicate an end of a synchronization field and a start of a data field.

19. The method of claim 1, wherein a header in the RF pulse synchronization preamble comprises signaling information, such as a modulation technique used by a transmitter, a time needed to transmit a payload, and a Cyclic Redundancy Check (CRC).

* * * * *